(12) United States Patent
Yang et al.

(10) Patent No.: US 12,471,508 B1
(45) Date of Patent: Nov. 11, 2025

(54) PHASE-CHANGE ELECTRICALLY-CONTROLLED PHOTONIC NEURON DEVICE AND PREPARATION METHOD AND APPLICATION THEREOF

(71) Applicant: HUAZHONG UNIVERSITY OF SCIENCE AND TECHNOLOGY, Hubei (CN)

(72) Inventors: Rui Yang, Hubei (CN); Yunxiao Dong, Hubei (CN); Xiangshui Miao, Hubei (CN)

(73) Assignee: HUAZHONG UNIVERSITY OF SCIENCE AND TECHNOLOGY, Hubei (CN)

( * ) Notice: Subject to any disclaimer, the term of this patent is extended or adjusted under 35 U.S.C. 154(b) by 0 days.

(21) Appl. No.: 19/218,356

(22) Filed: May 25, 2025

Related U.S. Application Data

(63) Continuation of application No. PCT/CN2024/114228, filed on Aug. 23, 2024.

(30) Foreign Application Priority Data

Aug. 15, 2024 (CN) .......................... 202411118385.1

(51) Int. Cl.
*H10N 70/20* (2023.01)
*G06N 3/065* (2023.01)
*H10N 70/00* (2023.01)

(52) U.S. Cl.
CPC .......... *H10N 70/231* (2023.02); *G06N 3/065* (2023.01); *H10N 70/021* (2023.02);
(Continued)

(58) Field of Classification Search
CPC .................................................. H10N 70/231
See application file for complete search history.

(56) References Cited

U.S. PATENT DOCUMENTS 8,203,134 B2 * 6/2012 Liu ...................... H10N 70/826
  257/E27.047
10,903,273 B2 * 1/2021 Cheng .................. H10N 70/231
(Continued)

FOREIGN PATENT DOCUMENTS

CN        115034377        9/2022
CN        115101666        9/2022
(Continued)

OTHER PUBLICATIONS

"International Search Report (Form PCT/ISA/210) of PCT/CN2024/114228", mailed on Apr. 10, 2025, pp. 1-3.
(Continued)

*Primary Examiner* — Mounir S Amer
(74) *Attorney, Agent, or Firm* — JCIPRNET

(57) ABSTRACT

The invention belongs to the field related to optoelectronic technology and discloses a novel phase-change electrically-controlled photonic neuron device and a preparation method and an application thereof. The device includes a substrate, a waveguide layer, a phase-change material layer, and a heating layer. A chemical formula of the phase-change material layer is $Sb_xTe_y$, where $x+y=1$ and $0.6<y<1$. The phase-change material layer has a Te phase and a $Sb_2Te_3$ phase embedded in the Te phase to form an island structure. When a temperature of the heating layer rises, the Te phase changes from a crystalline state to an amorphous state or a molten state, while the $Sb_2Te_3$ phase maintains a crystalline state. When the temperature drops, the Te phase spontaneously crystallizes at low temperature with the crystalline $Sb_2Te_3$ phase as a nucleation site simulating the process of spontaneously returning to a resting potential of neurons.

8 Claims, 6 Drawing Sheets

(52) U.S. Cl.
CPC ....... *H10N 70/841* (2023.02); *H10N 70/8613* (2023.02); *H10N 70/8828* (2023.02)

(56) References Cited

U.S. PATENT DOCUMENTS

| | | | |
|---|---|---|---|
| 2008/0149912 A1* | 6/2008 | Nakai | G11C 17/18 365/158 |
| 2010/0129995 A1 | 5/2010 | Im et al. | |
| 2019/0067570 A1* | 2/2019 | Tsai | H10B 63/80 |
| 2023/0371408 A1* | 11/2023 | Liu | H10B 63/10 |
| 2023/0413694 A1* | 12/2023 | Li | H10N 70/011 |
| 2025/0048940 A1* | 2/2025 | Redaelli | H10N 70/8828 |

FOREIGN PATENT DOCUMENTS

| | | |
|---|---|---|
| CN | 116027481 | 4/2023 |
| CN | 116661176 | 8/2023 |

OTHER PUBLICATIONS

"Written Opinion of the International Searching Authority (Form PCT/ISA/237) of PCT/CN2024/114228", mailed on Apr. 10, 2025, with English translation thereof, pp. 1-6.

* cited by examiner

PHASE-CHANGE ELECTRICALLY-CONTROLLED PHOTONIC NEURON DEVICE AND PREPARATION METHOD AND APPLICATION THEREOF

CROSS-REFERENCE TO RELATED APPLICATION

This application is a continuation of international PCT application serial no. PCT/CN2024/114228, filed on Aug. 23, 2024, which claims the priority benefit of China application no. 202411118385.1, filed on Aug. 15, 2024. The entirety of the above-mentioned patent application is hereby incorporated by reference herein and made a part of this specification.

BACKGROUND

Technical Field

The invention belongs to the technical field related to optoelectronic technology, and more specifically, relates to a novel phase-change electrically-controlled photonic neuron device and a preparation method and an application thereof.

Description of Related Art

Neuromorphic computing simulates the computational mode of human brain neural networks, which is a new computing paradigm integrating storage and computation. A photonic neural network, by utilizing the advantages of low power consumption, low latency, and ultra-high parallelism of photons, is able to greatly improve the operational efficiency of the system and thus exhibits significant application potential. A photonic neural network consists of photonic synapse devices and photonic neuron devices. Herein, as important components in the photonic neural network used to integrate synaptic signals and generate action potentials. The implementation of the photonic neuron devices usually includes on-chip and off-chip approaches, where the on-chip integrated devices may be compatible with other photonic active/passive devices to build an on-chip computing system and achieve more complex functions. Compared with off-chip integration, the on-chip integration has advantages such as smaller effective size, higher scalability, faster computation speed, and compatibility with electronic CMOS processes, and thus has received widespread attention.

A conventional on-chip integrated passive photonic device mainly relies on thermo-optic effects and carrier dispersion effects for regulation, so refractive index changes are limited, a larger size is needed to achieve optical transmittance changes, control circuits are complex, and power consumption is high. A photonic device constructed based on heterogeneous hybrid integrated waveguides with a phase-change material show considerable advantages, as the phase-change material possesses advantages such as fast phase transition, high optical contrast, and easy integration. However, the phase-change materials currently adopted are mainly $Ge_2Sb_2Te_5$ ternary and its doped systems, and the photonic neuron devices constructed from them have non-volatility and cannot automatically return to the resting potential, so feedback loops are required to control the neurons' return to the resting potential, and the complexity and scalability of a photonic neural network thus increase. Although Chinese patent application CN115034377A mentions the design of a volatile neuron material, it only provides one specific implementation example of a single-element Te neuron, and the problem of resting potential fluctuation thereby occurs.

Therefore, designing a volatile neuron device that can stably return to the resting potential is an urgent technical problem that needs to be solved.

SUMMARY

In response to the above defects or the needs for improvement, the invention provides a novel phase-change electrically-controlled photonic neuron device and a preparation method and an application thereof aiming to make a neuron device volatile and capable of stably returning to the resting potential.

To achieve the above, according to one aspect of the invention, the invention provides a novel phase-change electrically-controlled photonic neuron device including a substrate, a waveguide layer located on the substrate, a phase-change material layer located on the waveguide layer, and a heating layer for heating the phase-change material layer.

Herein, a chemical formula of the phase-change material layer is $Sb_xTe_y$, where x+y=1 and 0.6<y<1. The phase-change material layer has two phases with different physical properties, namely, a $Sb_2Te_3$ phase and a Te phase, and the $Sb_2Te_3$ phase is embedded in the Te phase to form an island structure.

When a temperature of the heating layer rises to higher than a Te phase state transition threshold, the Te phase changes from a crystalline state to an amorphous state or a molten state, and the $Sb_2Te_3$ phase maintains a crystalline state. When the temperature of the heating layer drops to lower than the Te phase state transition threshold, the Te phase uses the crystalline $Sb_2Te_3$ phase as a nucleation site and transforms from an amorphous state or a molten state to a crystalline state.

Further, the heating layer is selected from any one of ITO, $In_2O_3$, AZO, and $TiO_2$.

Further, the device further includes an electrode layer in contact with the heating layer, and the electrode layer is used to access an external power source and pass current into the heating layer to adjust the temperature of the heating layer.

Further, the electrode layer is one or a combination of Ti, Cr, Pt, Au, Al, and W.

The invention further provides a preparation method of a novel phase-change electrically-controlled photonic neuron device, and the preparation method includes the following steps.

A waveguide layer is formed on a substrate.

A phase-change material initial layer is formed on the waveguide layer. A chemical formula of the phase-change material initial layer is $Sb_xTe_y$, where x+y=1 and 0.6<y<1.

A heating layer is formed on the phase-change material initial layer.

Electrode layers are formed at both ends of the heating layer.

A pretreatment pulse voltage is applied to the electrode layers, and the phase-change material initial layer is heated through the heating layer, so that Sb atoms and Te atoms in the phase-change material initial layer combine to form a stable $Sb_2Te_3$ phase, and the $Sb_2Te_3$ phase is embedded in a Te phase to form an island structure to obtain a phase-change material layer.

Further, a voltage amplitude of the pretreatment pulse voltage is 0.5 V to 5 V, and a pulse width is 50 μs to 800 μs.

The invention further provides an on-chip photonic neural network system including a nonlinear activation layer and a regulation unit. The nonlinear activation layer is the novel phase-change electrically-controlled photonic neuron device according to the above. The regulation unit is used to apply a voltage pulse to the electrode layer, so that a transmittance of the phase-change material layer changes nonlinearly with a magnitude of the voltage pulse.

Further, the regulation unit is used to regulate an amplitude of the voltage pulse to regulate a light transmittance of the phase-change material layer.

The invention further provides an on-chip photonic neural network system including a probability activation layer and a regulation unit. The probability activation layer is the novel phase-change electrically-controlled photonic neuron device according to the above. The regulation unit is used to apply a voltage pulse to the electrode layer, so that a transmittance of the phase-change material layer changes randomly with a magnitude of the voltage pulse.

Further, the regulation unit is used to regulate a width of the voltage pulse to regulate a probability of random transmission of light through the phase-change material layer.

To sum up, the above technical solutions provided by the disclosure have the following beneficial effects compared with the related art.

The novel phase-change electrically-controlled photonic neuron device provided by the invention has a phase-change material layer, and the phase-change material layer uses two elements, Sb and Te. During preparation, two phases with different physical properties appear in the phase-change material layer, namely the $Sb_2Te_3$ phase and the Te phase, and the $Sb_2Te_3$ phase is embedded in the Te phase to form an island structure. The proportion of the two phases can be regulated by adjusting the proportion of the two elements, Sb and Te. The phase state transition threshold of the Te phase is lower than that of the $Sb_2Te_3$ phase. At room temperature, after the pretreatment, both the $Sb_2Te_3$ phase and the Te phase are in crystalline state. When a temperature of the heating layer rises to higher than the Te phase state transition threshold, under the thermal induction of the heating layer, the Te phase changes from a crystalline state to an amorphous state or a molten state, while the $Sb_2Te_3$ phase maintains a crystalline state. When the temperature drops, the Te phase spontaneously crystallizes at low temperature and produces volatile changes. Further, during crystallization, with an appropriate amount of crystalline $Sb_2Te_3$ phase as the nucleation site, rapid and stable crystallization of the phase-change material layer are facilitated. The difference in optical constants before and after the material phase change causes the transmittance of light through the phase-change material layer in the waveguide to undergo volatile changes, so the function of neurons spontaneously returning to a stable resting potential is achieved.

DESCRIPTION OF THE EMBODIMENTS

In order to make the objectives, technical solutions, and advantages of the invention clearer and more comprehensible, the invention is further described in detail with reference to the drawings and embodiments. It should be understood that the specific embodiments described herein serve to explain the invention merely and are not used to limit the invention. In addition, the technical features involved in the various embodiments of the invention described below can be combined with each other as long as the technical features do not conflict with each other.

Figure 1:
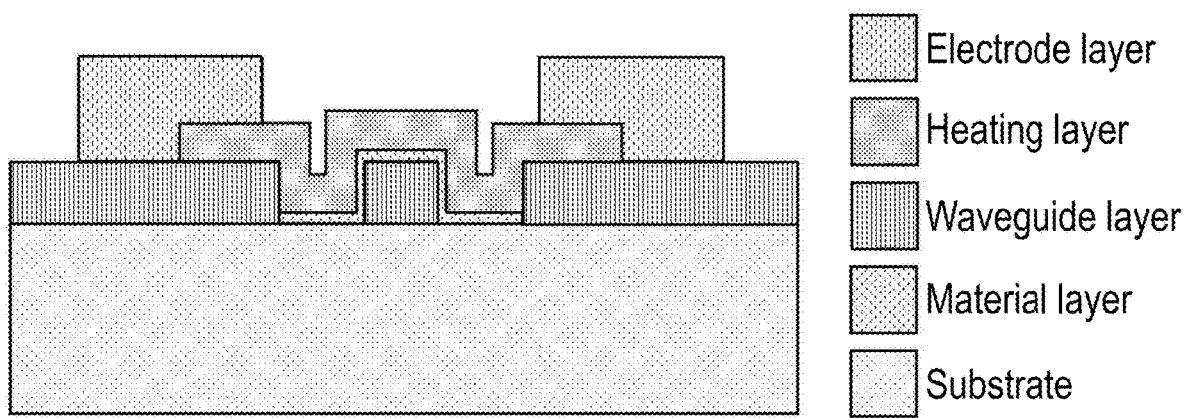
FIG. 1 is a schematic view of a structure of a novel phase-change electrically-controlled photonic neuron device in an embodiment of the invention.

As shown in FIG. 1, which is a schematic view of a structure of a novel phase-change electrically-controlled photonic neuron device in an embodiment of the invention, including a substrate, a waveguide layer located on the substrate, a phase-change material layer located on the waveguide layer, and a heating layer for heating the phase-change material layer. Herein, a chemical formula of the phase-change material layer is $Sb_xTe_y$, where x+y=1 and 0.6<y<1. The phase-change material layer has two phases with different physical properties, namely, a $Sb_2Te_3$ phase and a Te phase, and the $Sb_2Te_3$ phase is embedded in the Te phase to form an island structure. When a temperature of the heating layer rises to higher than a Te phase state transition threshold, the Te phase changes from a crystalline state to an amorphous state or a molten state, and the $Sb_2Te_3$ phase maintains a crystalline state. When the temperature of the heating layer drops to lower than the Te phase state transition threshold (generally below 50° C.), the Te phase uses the crystalline $Sb_2Te_3$ phase as a nucleation site and transforms from an amorphous state or a molten state to a crystalline state. The difference in optical constants before and after the material phase change causes a transmittance of light through the phase-change material layer in the waveguide to undergo volatile changes, so the function of neurons spontaneously returning to a resting potential is achieved.

Figure 2:
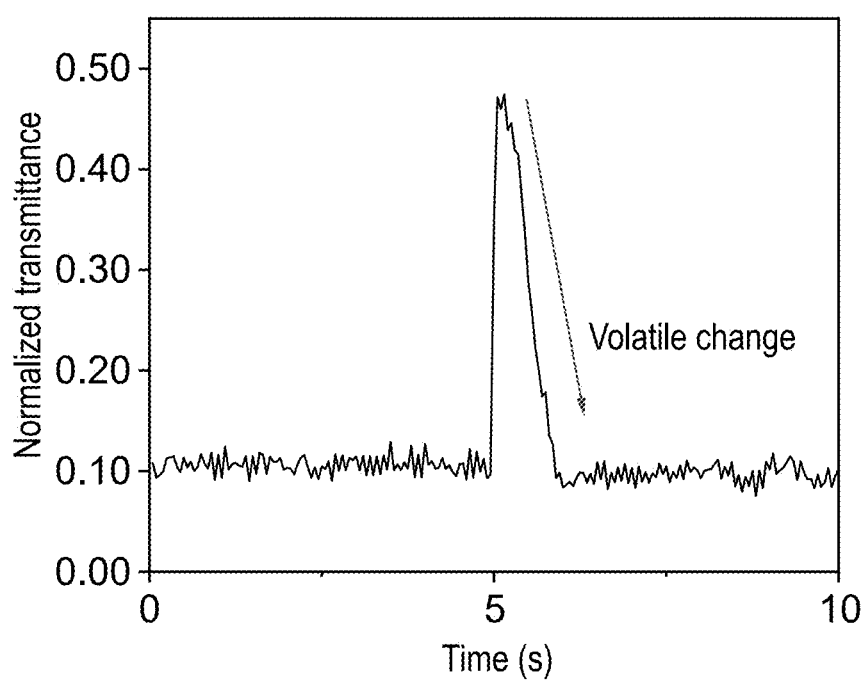
FIG. 2 is an optical response chart of the neuron device in an embodiment of the invention.

As shown in FIG. 2, which is an optical response chart of the neuron device in an embodiment of the invention. After an electrical pulse is applied, heat is conducted to the phase-change material layer, optical transmission changes, and it can spontaneously return to the resting potential of the neurons, so volatile changes are exhibited.

Herein, different heating approaches may be used to control the temperature of the heating layer, so as to regulate a phase state of the phase-change material layer. In this embodiment, the approach of applying electrical power is used to regulate the temperature of the heating layer. Specifically, the device also includes an electrode layer in contact with the heating layer, and the electrode layer is used to access an external power source and pass current into the heating layer to adjust the temperature of the heating layer. The two electrodes have no polarity distinction and are used to apply electrical signals to the device. An external electric field enters the device through one electrode, flows through the heating layer, and exits the device through another electrode, forming an electrical circuit. The heating layer has a certain resistance, and when current flows through the heating layer, it generates Joule heating effect, the heat is conducted to the phase-change material layer, inducing phase transition of the material. By controlling an electrical pulse signal, a temperature of the phase-change material layer may be controlled, so a material phase state is controlled, and firing of the neurons is further affected.

Specifically, shapes of the phase-change material layer, the heating layer, and the electrode layer may be determined according to heating efficiency and neuron performance needs, and may be one or a combination of rectangle, trapezoid, triangle, circle, or cone.

Herein, the heating layer should be selected from an optically transparent material, such as one of ITO, $In_2O_3$, AZO, $TiO_2$, to reduce interference with light transmittance. Specifically, a thickness of the heating layer may be selected from 50 nm to 500 nm. The electrode layer is selected from a material with good conductivity, such as one or a combination of Ti, Cr, Pt, Au, Al, W, for electrical conduction. Specifically, a thickness of the electrode layer may be selected from 50 nm to 300 nm.

Further, isolation layers may be introduced above and below the phase-change material layer to enhance a heat transfer effect of the heating layer or limit volume expansion during a phase change of the material. A material of the isolation layers is one of $SiO_2$ or $Al_2O_3$.

In a specific embodiment, a thickness of the phase-change material layer may be selected from 5 nm to 100 nm, and a width may be selected from 1 μm to 20 μm.

Figure 3:
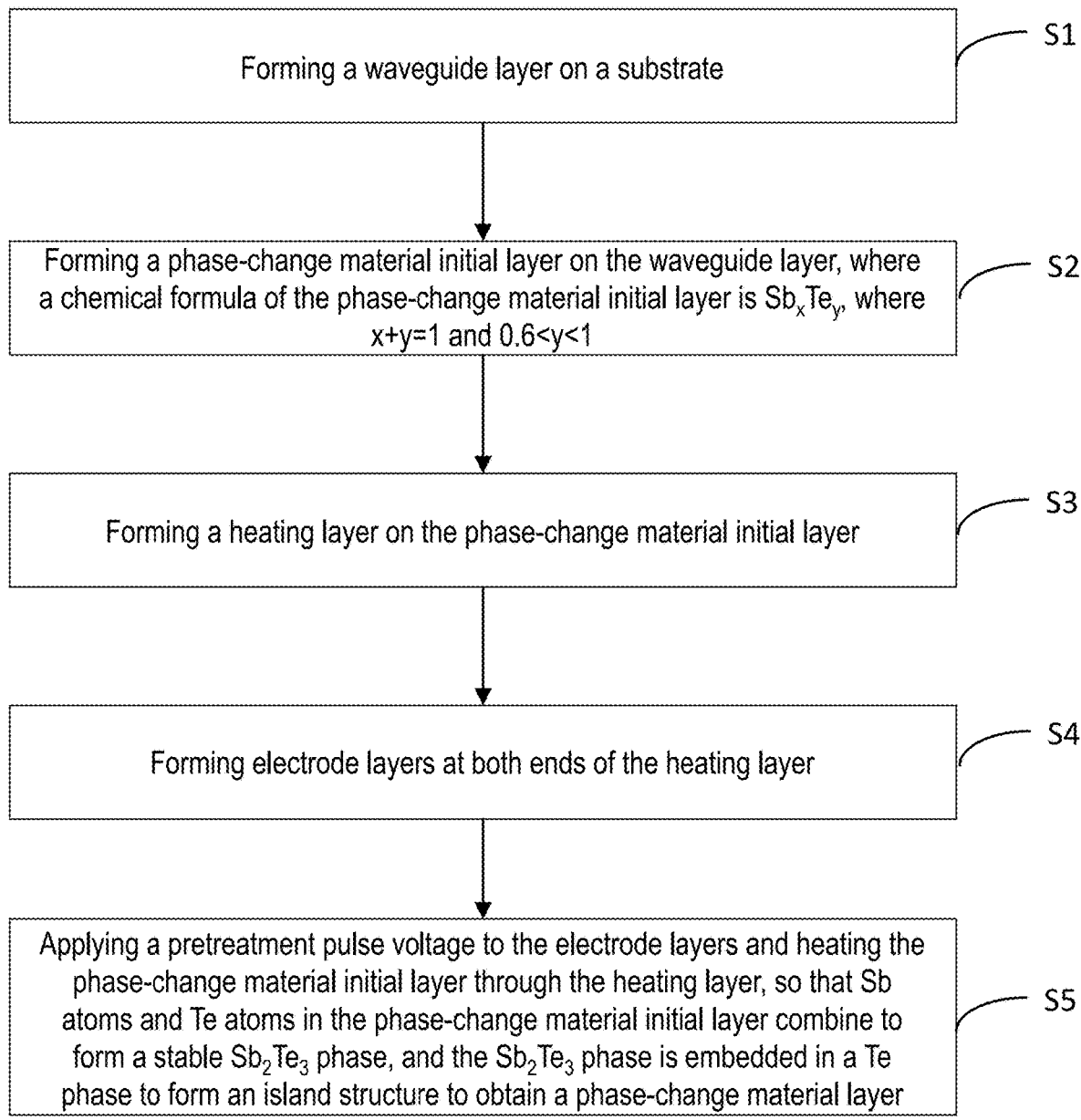
FIG. 3 is a flow chart of steps of a preparation method of a novel phase-change electrically-controlled photonic neuron device in an embodiment of the invention.

As shown in FIG. 3, which is a flow chart of steps of a preparation method of a novel phase-change electrically-controlled photonic neuron device in an embodiment of the invention used to prepare the novel phase-change electrically-controlled photonic neuron device introduced in the foregoing paragraphs. Steps S1 to S5 are mainly included, and the following is a detailed introduction of each step.

In step S1, a waveguide layer is formed on a substrate.

Specifically, a waveguide and a grating pattern were drawn using Klayout software. A 1 cm×1 cm SOI silicon wafer was selected for spin coating with photoresist and then developed and fixed after electron beam lithography (EBL) to obtain the waveguide and a grating pattern window. 220 nm of inductively coupled plasma (ICP) etching was performed, and the waveguide was obtained after stripping the photoresist.

In step S2, a phase-change material initial layer is formed on the waveguide layer, where a chemical formula of the phase-change material initial layer is $Sb_xTe_y$, where x+y=1 and 0.6<y<1.

Specifically, a material size pattern was drawn using the Klayout software. The silicon wafer in S1 was spin-coated with photoresist and developed after ultraviolet light exposure to obtain a material pattern window. A phase-change material initial layer was fabricated by magnetron sputtering, and then the phase-change material initial layer was formed by a lift-off process in acetone and ethanol. At this time, the Sb atoms and the Te atoms were not yet combined.

In step S3, a heating layer is formed on the phase-change material initial layer.

Specifically, a size pattern of the heating layer was drawn using the Klayout software, and the heating layer needed to completely cover the phase change material layer. The silicon wafer in S2 was spin-coated with photoresist and developed after ultraviolet light exposure to obtain a heating layer pattern window. A heating layer material was fabricated by magnetron sputtering, and then the heating layer was formed by a lift-off process in acetone and ethanol.

In step S4, electrode layers are formed at both ends of the heating layer.

Specifically, an electrode layer size pattern was drawn using the Klayout software. The electrode layers were located at both ends of a heating layer pattern and could not contact the waveguide. The silicon wafer in S3 was spin-coated with photoresist and developed after ultraviolet light exposure to obtain an electrode layer pattern window. An electrode layer material was fabricated by magnetron sputtering, and then the electrode layer was formed by a lift-off process in acetone and ethanol.

In step S5, a pretreatment pulse voltage is applied to the electrode layers and the phase-change material initial layer is heated through the heating layer, so that Sb atoms and Te atoms in the phase-change material initial layer combine to form a stable $Sb_2Te_3$ phase, and the $Sb_2Te_3$ phase is embedded in a Te phase to form an island structure to obtain a phase-change material layer.

According to conventional methods, the phase-change layer obtained by sputtering is generally directly introduced into a neural network, but experiments have found that the neuron device obtained at this point cannot stably achieve switching, and its neurons cannot return to a stable resting potential. After analysis, it may be because during the phase change process, the phase change region, crystal grain growth orientation, growth rate, etc. cannot be completely identical, resulting in significant differences in the crystal structure formed after each crystallization, thus making it incapable to stably recover to the resting potential. In the invention, through step S5, the phase-change material initial layer obtained by sputtering is subjected to heating pretreatment, causing the Sb atoms and the Te atoms to combine to form the stable $Sb_2Te_3$ phase. The $Sb_2Te_3$ phase is embedded in the Te phase and forms an island structure, providing a nucleation site for the Te crystallization process. Crystallization preferentially occurs at grain boundaries, so that the crystallization orientation and grain size of Te crystals are regulated. Fast and stable crystallization of the phase-change material layer are thus facilitated in this way, and the function of neurons spontaneously returning to a stable resting potential is achieved. Specifically, Sb atoms are generally uniformly distributed and dispersed, and therefore, the island structure after pretreatment is also uniformly distributed basically.

Figure 4:
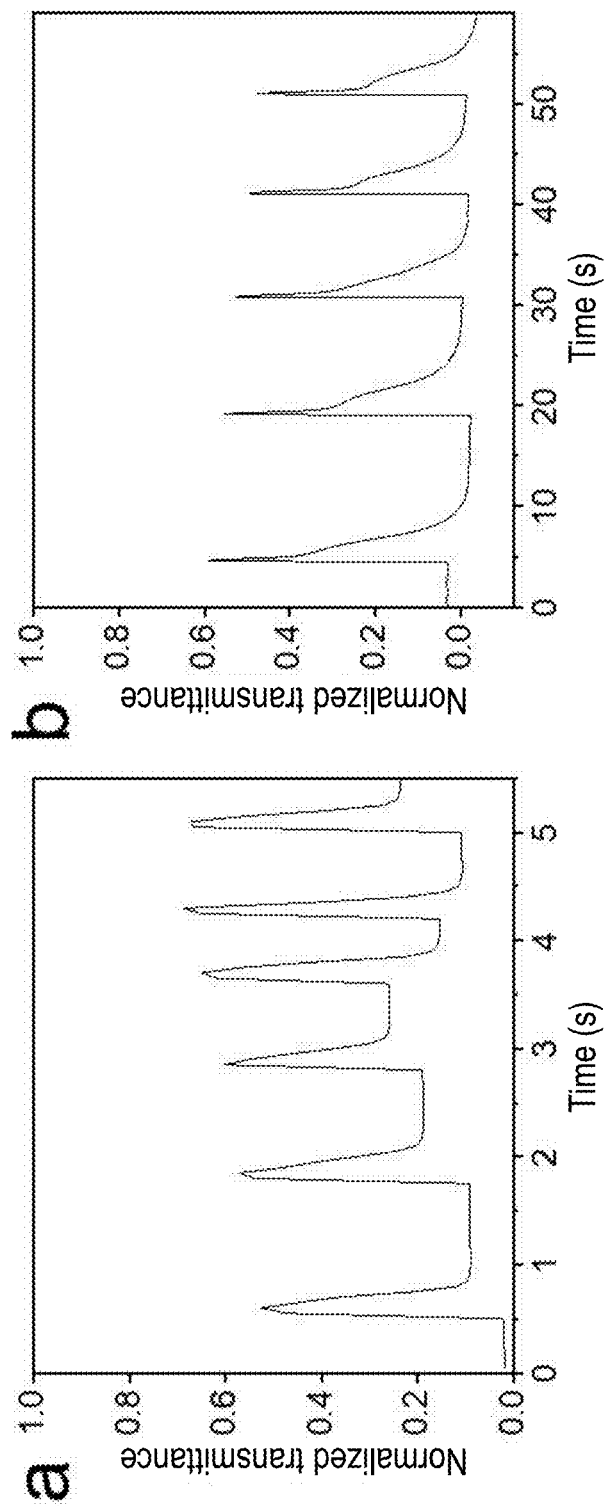
FIG. 4 is responses of the neuron device to optical signals without and with heating pretreatment in an embodiment, where figure a is the response of the neuron device to the optical signal without heating pretreatment, and figure b is the response of the neuron device to the optical signal with heating pretreatment.

As shown in FIG. 4, which is responses of the neuron device to optical signals without and with heating pretreatment in an embodiment, where figure a is the response of the neuron device to the optical signal without heating pretreatment, and figure b is the response of the neuron device to the optical signal with heating pretreatment. From this, it can be seen that the device without pretreatment contains free Sb atoms and Te atoms, which can produce volatile changes but with unstable switching, while after pretreatment, the $Sb_2Te_3$ phase is embedded in the Te phase and forms an island structure, making the neuron device switching more stable.

For an on-chip structure, since it is incapable to heat an entire neural network chip, in the invention, the phase-change material initial layer is heated by applying a low-power and long-duration electrical pulse, so that Sb atoms and Te atoms combine to form the stable $Sb_2Te_3$ phase without affecting other structures. Specifically, a voltage amplitude is 0.5 V to 5 V and a pulse width is 50 s to 800 s, so that the heating layer heats the phase-change material to a specific temperature and maintains it for a relatively long time without causing phase change, so as to pre-treat the neuron device. The purpose is to make the Sb in the phase-change material layer bond with surrounding atoms to form the island-structured $Sb_2Te_3$ phase, after which the resulting photonic neuron device may be used for a neural network.

Figure 5:
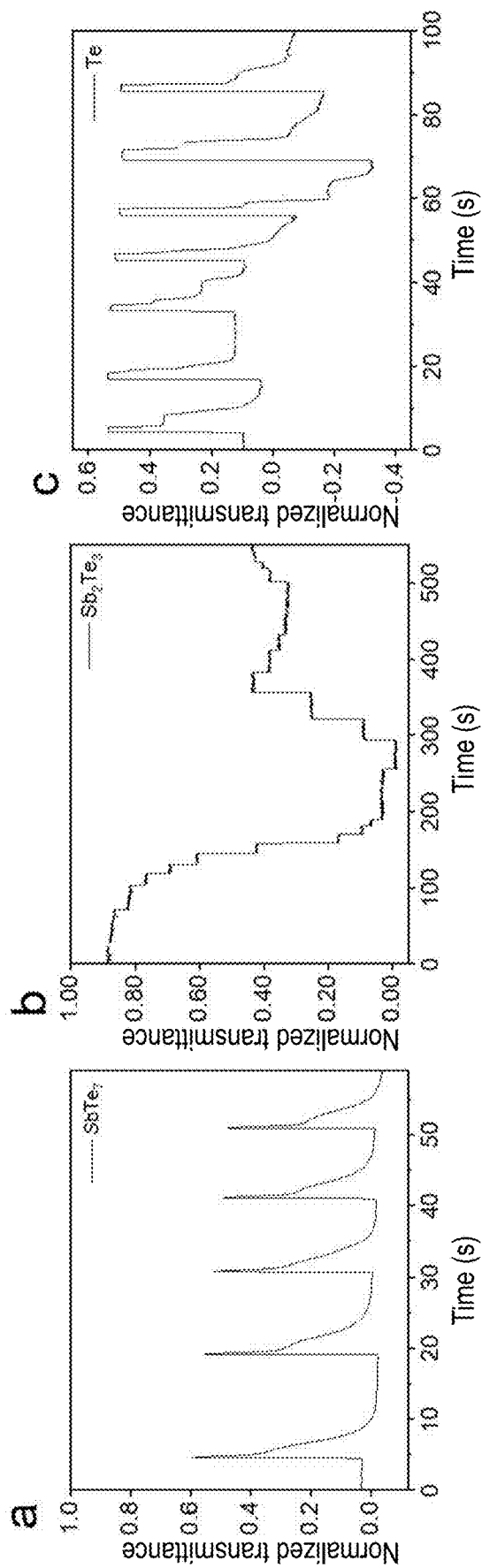
As shown in FIG. 5, which illustrates responses of three different neuron devices to optical signals after heating pretreatment, where figure a is the response of a $SbTe_7$ (y=0.875) device to optical signals, figure b is the response of a $Sb_2Te_3$ device (y=0.6) to optical signals, and figure c is the response of a Te device (y=1) to optical signals.

As shown in FIG. 5, which is responses of three different neuron devices to optical signals after heating pretreatment, where figure a is the response of a $SbTe_7$ (y=0.875) device to optical signals, figure b is the response of a $Sb_2Te_3$ device (y=0.6) to optical signals, and figure c is the response of a Te device (y=1) to optical signals. From these, it can be seen that: the $SbTe_7$ device possesses stable and volatile optical response performance, the $Sb_2Te_3$ device possesses non-volatile switching, which cannot meet the function of the neuron device, and the Te device possesses volatile switching response but with unstable switching, meaning that the Te device shows volatile changes under electric field, but due to the unstable crystallization of Te, it cannot volatilely return to the same resting potential in a stable manner.

Correspondingly, the invention also relates to an on-chip photonic neural network system including a nonlinear activation layer and a regulation unit. The nonlinear activation layer is the novel phase-change electrically-controlled photonic neuron device with the electrode layer introduced in the foregoing paragraphs, and the regulation unit is used to apply a voltage pulse to the electrode layer, with the transmittance of the phase-change material layer changing nonlinearly with a magnitude of the voltage pulse.

Regarding the neuron device obtained through the method introduced in the foregoing paragraphs, when conducting phase state modulation, an external electric field excitation is required to provide thermal energy to the heating layer material, so as to drive the phase transition of the phase-change material layer. This is essentially direct thermal-induced phase change of the heating layer, but the heat is affected by the electric field, and different electric pulse parameters affect the generation and distribution of heat.

In a neural network, the nonlinear activation layer implements nonlinear functions and is a critical structure. Optical nonlinear functions are represented by the optical transmittance of the neuron device. Under different regulation parameters, the optical transmittance at the output end of the neuron device changes nonlinearly with the regulation parameters. Adjustable parameters include: voltage amplitude, pulse width, pulse period, duty cycle, rising/falling edge, pulse waveform, and number of pulses. In this embodiment, by adjusting the voltage amplitude, the neuron device achieves nonlinear activation functions. Under different voltages, the phase-change material reaches different degrees of phase transition and thus responds differently to optical signals, has different optical contrast, changes nonlinearly with pulse width, and may be used for implementing the nonlinear activation layer in a neural network.

Correspondingly, the invention also relates to another on-chip photonic neural network system including a probability activation layer and a regulation unit. The probability activation layer is the novel phase-change electrically-controlled photonic neuron device with the electrode layer introduced in the foregoing paragraphs, and the regulation unit is used to apply a voltage pulse to the electrode layer, with the transmittance of the phase-change material layer changing randomly with a magnitude of the voltage pulse.

Due to the randomness in the distribution of the $Sb_2Te_3$ phase in the volatile phase-change material, there is also randomness in heat distribution during the heat-induced phase change process. Under high voltage short-time pulses, the heat reaching the material surface is limited, and heat may be randomly absorbed by some grains, causing phase transition in some grains. The probabilistic firing characteristics of neurons are thereby produced. Specifically, when other parameters remain unchanged, the voltage amplitude has a greater impact on the temperature of the phase-change material layer, and it is difficult to control the temperature of the phase-change material more precisely by controlling the voltage amplitude. In this embodiment, a pulse width adjustment method is adopted. The method is by changing the pulse width near a phase-change threshold voltage, the temperature of the phase-change material layer can be adjusted, so as to control a more subtle amount of heat reaching the material and to more precisely regulate the firing probability of neurons. Due to the two-phase structure inside the material, adjusting the pulse width at a fixed voltage amplitude may cause the temperature reaching the interior of the material to be randomly distributed. The material undergoes a partial random phase change in this way, and probabilistic modulation is produced in the optical signal, so the probabilistic firing of neurons is achieved, which can be used in the probabilistic computation of neurons in a neural network.

Figure 6:
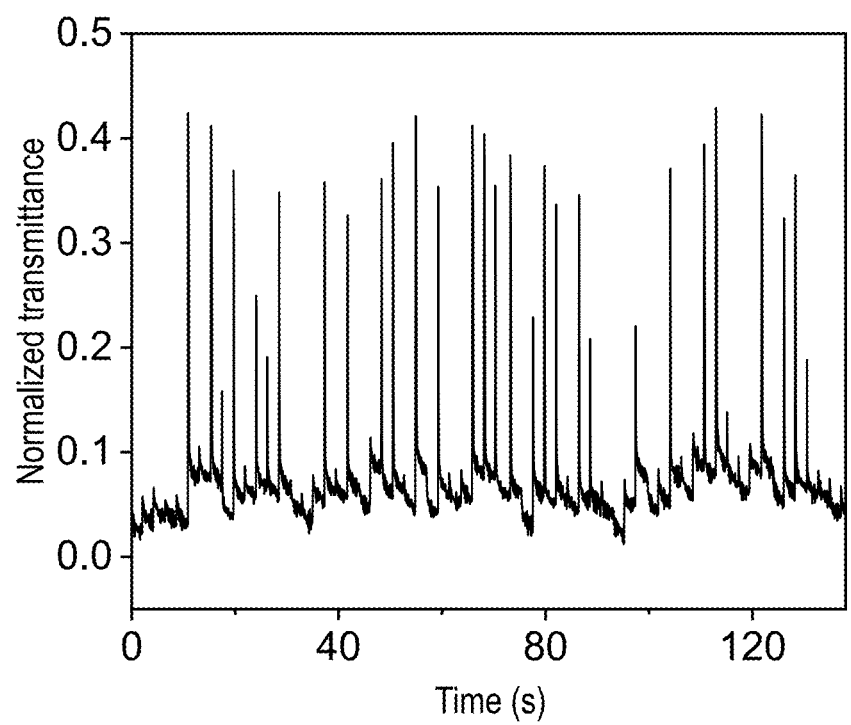
FIG. 6 is a schematic chart of a probability response of the neuron device implementing neurons in an embodiment of the present application.

As shown in FIG. 6, which is a schematic chart of a probability response of the neuron device implementing neurons in an embodiment of the present application. Under the same electric pulse, the generation of neuron action potentials exhibits randomness, which is used for a probabilistic neuron layer in a neural network.

The technical features of the above-described embodiments may be combined arbitrarily. In order to simplify the description, not all possible combinations of the technical features in the above embodiments are described. However, as long as there is no contradiction in the combinations of these technical features, these combinations should be considered to be within the scope of the description in this specification. It should be noted that "in an embodiment", "for instance", "further example", etc. in the invention are intended to provide exemplary illustrations of the invention and are not intended to limit the invention.

The abovementioned embodiments only represent several embodiments of the invention, and the descriptions thereof are specific and detailed, but should not be construed as a limitation on the scope of the invention patent. It should be pointed out that for a person having ordinary skill in the art, without departing from the concept of the invention, several modifications and improvements can be made, which all belong to the protection scope of the invention.

What is claimed is:

1. A novel phase-change electrically-controlled photonic neuron device, comprising a substrate, a waveguide layer located on the substrate, a phase-change material layer located on the waveguide layer, and a heating layer for heating the phase-change material layer, wherein a chemical formula of the phase-change material layer is $Sb_xTe_y$, where x+y=1 and 0.6<y<1, the phase-change material layer has two phases with different physical properties, a $Sb_2Te_3$ phase and a Te phase respectively, and the $Sb_2Te_3$ phase is embedded in the Te phase to form an island structure, when a temperature of the heating layer rises to higher than a Te phase state transition threshold, the Te phase changes from a crystalline state to an amorphous state or a molten state, and the $Sb_2Te_3$ phase maintains a crystalline state, and when the temperature of the heating layer drops to lower than the Te phase state transition threshold, the Te phase uses the $Sb_2Te_3$ phase in crystalline state as a nucleation site and transforms from an amorphous state or a molten state to a crystalline state.

2. The novel phase-change electrically-controlled photonic neuron device according to claim 1, wherein the heating layer is selected from any one of ITO, $In_2O_3$, AZO, and $TiO_2$.

3. The novel phase-change electrically-controlled photonic neuron device according to claim 1, wherein the device further comprises an electrode layer in contact with the heating layer, and the electrode layer is used to access an external power source and pass current into the heating layer to adjust the temperature of the heating layer.

4. The novel phase-change electrically-controlled photonic neuron device according to claim 3, wherein the electrode layer is one or a combination of Ti, Cr, Pt, Au, Al, and W.

5. An on-chip photonic neural network system, comprising a nonlinear activation layer and a regulation unit, wherein the nonlinear activation layer is the novel phase-change electrically-controlled photonic neuron device according to claim 3, and the regulation unit is used to apply a voltage pulse to the electrode layer, so that a transmittance of the nonlinear activation layer changes nonlinearly with a magnitude of the voltage pulse.

6. The on-chip photonic neural network system according to claim 5, wherein the regulation unit is used to regulate an amplitude of the voltage pulse to regulate a light transmittance of the phase-change material layer.

7. An on-chip photonic neural network system, comprising a probability activation layer and a regulation unit, wherein the probability activation layer is the novel phase-change electrically-controlled photonic neuron device according to claim 3, and the regulation unit is used to apply a voltage pulse to the electrode layer, so that a transmittance of the phase-change material layer changes randomly with a magnitude of the voltage pulse.

8. The on-chip photonic neural network system according to claim 7, wherein the regulation unit is used to regulate a width of the voltage pulse to regulate a probability of random transmission of light through the phase-change material layer.

* * * * *